United States Patent
Liu et al.

(10) Patent No.: US 9,698,248 B2
(45) Date of Patent: Jul. 4, 2017

(54) POWER MOS TRANSISTOR AND MANUFACTURING METHOD THEREFOR

(71) Applicant: SU ZHOU ORIENTAL SEMICONDUCTOR CO.,LTD, Suzhou (CN)

(72) Inventors: Wei Liu, Suzhou (CN); Lei Liu, Suzhou (CN); Xi Lin, Suzhou (CN); Pengfei Wang, Suzhou (CN); Yi Gong, Suzhou (CN)

(73) Assignee: SU ZHOU ORIENTAL SEMICONDUCTOR CO., LTD, Suzhou (CN)

( * ) Notice: Subject to any disclaimer, the term of this patent is extended or adjusted under 35 U.S.C. 154(b) by 0 days.

(21) Appl. No.: 15/028,718

(22) PCT Filed: Aug. 4, 2014

(86) PCT No.: PCT/CN2014/083642
§ 371 (c)(1),
(2) Date: Apr. 12, 2016

(87) PCT Pub. No.: WO2016/011674
PCT Pub. Date: Jan. 28, 2016

(65) Prior Publication Data
US 2016/0276464 A1    Sep. 22, 2016

(30) Foreign Application Priority Data

Jul. 25, 2014   (CN) .......................... 2014 1 0357005
Jul. 25, 2014   (CN) .......................... 2014 1 0357032
Jul. 25, 2014   (CN) .......................... 2014 1 0357033

(51) Int. Cl.
*H01L 29/66*       (2006.01)
*H01L 29/78*       (2006.01)
(Continued)

(52) U.S. Cl.
CPC .. *H01L 29/66734* (2013.01); *H01L 21/02238* (2013.01); *H01L 21/26506* (2013.01);
(Continued)

(58) Field of Classification Search
CPC ........... H01L 29/66734; H01L 29/7813; H01L 29/157; H01L 21/306; H01L 21/28035;
(Continued)

(56) References Cited

U.S. PATENT DOCUMENTS

| 5,637,898 A | 6/1997 | Baliga |
| 2005/0051814 A1 | 3/2005 | Miyake |

(Continued)

FOREIGN PATENT DOCUMENTS

| CN | 101752423 A | 6/2010 |
| CN | 102169896 A | 8/2011 |

(Continued)

*Primary Examiner* — Cuong B Nguyen
(74) *Attorney, Agent, or Firm* — Gokalp Bayramoglu (57) ABSTRACT

The present invention discloses a power Metal Oxide Semiconductor (MOS) transistor, wherein a second U-shaped trench is formed below a first U-shaped trench, so that a field oxidation stress transition region can be extended, so as to greatly reduce current leakage caused by the field oxidation stress and improve the reliability of the device; and a charge compensation region is provided in a drift region at the bottom of the second U-shaped trench, and a super-junction structure is formed between the charge compensation region and the drift region to improve the breakdown voltage of the power device. According to the present invention, the second U-shaped trench and the charge compensation region are formed by a self-aligning process, so that the technical process is simple, reliable and easy to control, and can reduce the manufacturing cost of the power MOS transistor and improve its yield.

4 Claims, 8 Drawing Sheets

(51) Int. Cl.
*H01L 21/02* (2006.01)
*H01L 21/265* (2006.01)
*H01L 21/28* (2006.01)
*H01L 21/306* (2006.01)
*H01L 29/10* (2006.01)
*H01L 29/15* (2006.01)
*H01L 29/423* (2006.01)
*H01L 21/308* (2006.01)
*H01L 21/32* (2006.01)

(52) U.S. Cl.
CPC ...... *H01L 21/28035* (2013.01); *H01L 21/306* (2013.01); *H01L 21/3083* (2013.01); *H01L 21/32* (2013.01); *H01L 29/1095* (2013.01); *H01L 29/157* (2013.01); *H01L 29/42368* (2013.01); *H01L 29/78* (2013.01); *H01L 29/7813* (2013.01)

(58) Field of Classification Search
CPC ............... H01L 29/78; H01L 21/26506; H01L 21/3083; H01L 29/0696; H01L 29/1095; H01L 29/66325–29/66333; H01L 29/7302; H01L 29/7393–29/7395
See application file for complete search history.

(56) References Cited

U.S. PATENT DOCUMENTS

2005/0285153 A1    12/2005  Weis et al.
2014/0239382 A1*   8/2014   Bobde ............... H01L 29/66719
                                                    257/328

FOREIGN PATENT DOCUMENTS

| CN | 102254944 A | 11/2011 |
| CN | 102315264 A | 1/2012 |
| CN | 102569075 A | 7/2012 |
| WO | WO03021639 | 3/2003 |

* cited by examiner

FIG. 19

POWER MOS TRANSISTOR AND MANUFACTURING METHOD THEREFOR

FIELD OF THE INVENTION

The present invention relates to the technical field of semiconductor power devices, and more particularly to a power MOS transistor and a manufacturing method thereof.

DESCRIPTION OF RELATED ART

With continuous deep development of modern microelectronic technology, the power MOS transistor gradually replaces bipolar devices and becomes the mainstream of the development of semiconductor power devices nowadays due to its advantages such as high input impedance, low loss, high switching speed, no secondary breakdown, wide safe operating area, good dynamic performance, easiness in being coupled with the anterior pole to realize high current, as well as high conversion efficiency. Conventional semiconductor power devices mainly comprise the types such as planar diffusion type MOS transistors and trench type MOS transistors. Taking the trench type MOS transistor as an example, the area of the device adopting the vertical channel structure is much smaller than the planar diffusion MOS transistor, thus the current density thereof is greatly improved.

Figure 1:
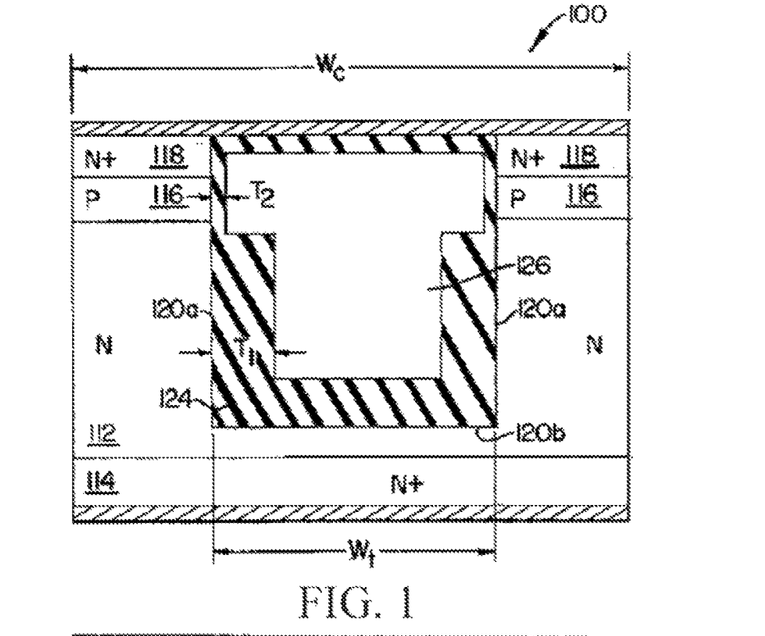
FIG. 1 is a schematic diagram of a sectional structure of a first power MOS transistor of the prior art.

U.S. Pat. No. 5,637,898 proposed a "power MOS transistor of U-shaped trench and manufacturing method thereof", the sectional structure of the power MOS transistor of the U-shaped trench is as shown in FIG. 1, the lower half of the U-shaped trench extends into a drift region 112, a thick field oxide layer is formed on the surface of the lower half of the U-shaped trench, and a thin gate oxide layer covering the channel region is formed on the upper half of the U-shaped trench, so that the power MOS transistor of the U-shaped trench can reduce the gate oxide capacitance. However, the power MOS transistor of the U-shaped trench needs to be provided with a deep trench, so that the manufacturing process of the gate oxide layer is very complicated, the manufacturing cost is high, and the yield of the device is reduced.

Figure 2:
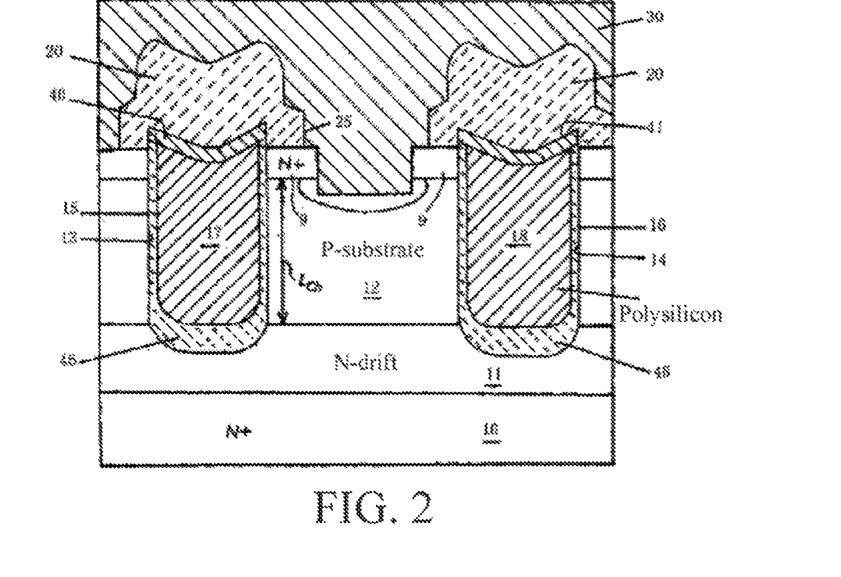
FIG. 2 is a schematic diagram of a sectional structure of a second power MOS transistor of the prior art.

To solve the above problems, a power MOS transistor of a U-shaped trench was proposed in the "trench field effect transistor with self-aligned source and contact" solution disclosed by the International Patent Application PCT/US2002/028067, its sectional structure is as shown in FIG. 2, specifically, a field oxide layer (45) thicker than a gate oxide layer is provided only at the bottom of the U-shaped trench, which can reduce the gate oxide capacitance so as to improve the switching speed. However, the power MOS transistor also has obvious shortcomings as below: 1. the transition region between the thick field oxide layer at the bottom of the U-shaped trench and the thin gate oxide layer of the channel region is too small, which increases the field oxidation stress at the bottom and therefore leads to the problems of current leakage and reduction of the reliability; and 2. due to the restriction of the breakdown voltage, the doping concentration of its silicon epitaxial layer is relatively low, which increases its on-resistance and restricts the performance of the power MOS transistor of the U-shaped trench.

SUMMARY OF THE INVENTION

Technical Problem

The objective of the present invention is to overcome the shortcomings of the prior art and provide a power MOS transistor and a manufacturing method thereof. On the one hand, a second U-shaped trench is provided below a first U-shaped trench of the powder MOS transistor, which enables the field oxidation stress transition region to be extended, so as to greatly reduce current leakage caused by the field oxidation stress and improve the reliability of the device; and on the other hand, a super-junction structure is formed by providing a charge compensation region in the drift region at the bottom of the second U-shaped trench to improve the breakdown voltage of the power MOS transistor.

Technical Solution

According to technical solution 1, the power MOS transistor proposed by the present invention comprises:
a drain region of a first doping type in a semiconductor substrate, a drift region of the first doping type, a channel region of a second doping type, a source region of the first doping type and a first U-shaped trench, wherein the drain region is provided at the bottom of the semiconductor substrate, the drift region is provided above the drain region, the channel region is provided on both sides of side walls of the first U-shaped trench and above the drift region, the bottom of the first U-shaped trench extends into the drift region, a gate oxide layer covering the channel region is provided on both side walls of the first U-shaped trench, and the source region is provided at the top of the semiconductor substrate and above the channel region;
a channel region contact region is provided in the channel region, the doping type of the channel region contact region is the same as that of the channel region, and a doping concentration of the channel region contact region is greater than that of the channel region;
characterized by further comprising:
a second U-shaped trench in the semiconductor substrate, wherein the second U-shaped trench is provided below the first U-shaped trench, the opening width of the second U-shaped trench is smaller than that of the first U-shaped trench, and the depth of the second U-shaped trench is 10-100 nm; and
a field oxide layer is provided in the second U-shaped trench, the thickness of the field oxide layer is greater than that of the gate oxide layer, and a polysilicon gate covering the gate oxide layer and the field oxide layer is provided in the first U-shaped trench and the second U-shaped trench.

A further preferred solution of technical solution 1 of the power MOS transistor of the present invention is as follows: the channel region contact region in technical solution 1 of the present invention is provided at the top of the semiconductor substrate and is adjacent to the source region, or is recessed in the semiconductor substrate.

An upper surface of the polysilicon gate in technical solution 1 of the present invention is lower than an opening surface of the first U-shaped trench, and insulating layers are provided above the polysilicon gate and at the top of the first U-shaped trench.

In technical solution 1 of the present invention, the first doping type is n-type doping, and the second doping type is p-type doping; or the first doping type is p-type doping, and the second doping type is n-type doping.

According to technical solution 2, the power MOS transistor proposed by the present invention comprises:
a drain region of a first doping type in a semiconductor substrate, a drift region of the first doping type, a channel region of a second doping type, a source region of the first doping type and a first U-shaped trench, wherein the drain region is provided at the bottom of the semiconductor substrate, the drift region is provided above the drain region, the channel region is provided on both sides of side walls of the first U-shaped trench and above the drift region, the bottom of the first U-shaped trench extends into the drift region, a gate oxide layer covering the channel region is provided on both side walls of the first U-shaped trench, and the source region is provided at the top of the semiconductor substrate and above the channel region;
a channel region contact region is provided in the channel region, and the doping type of the channel region contact region is the same as that of the channel region, and a doping concentration of the channel region contact region is greater than that of the channel region;
characterized by further comprising:
a second U-shaped trench in the semiconductor substrate, wherein the second U-shaped trench is provided below the first U-shaped trench, the opening width of the second U-shaped trench is smaller than that of the first U-shaped trench, and the depth of the second U-shaped trench is 10-100 nm;
a field oxide layer is provided in the second U-shaped trench, the thickness of the field oxide layer is greater than that of the gate oxide layer, a charge compensation region is provided in the drift region below the field oxide layer, and the charge compensation region has the second doping type; and
a polysilicon gate covering the gate oxide layer and the field oxide layer is provided in the first U-shaped trench and the second U-shaped trench.

A further preferred solution of technical solution 2 of the power MOS transistor of the present invention is as follows: the channel region contact region in technical solution 2 of the present invention is provided at the top of the semiconductor substrate and is adjacent to the source region, or is recessed in the semiconductor substrate.

An upper surface of the polysilicon gate in technical solution 2 of the present invention is lower than an opening surface of the first U-shaped trench, and insulating layers are provided above the polysilicon gate and at the top of the first U-shaped trench.

In technical solution 2 of the present invention, the first doping type is n-type doping, and the second doping type is p-type doping; or the first doping type is p-type doping, and the second doping type is n-type doping.

According to technical solution 3, the power MOS transistor proposed by the present invention comprises:
a drain region of a second doping type in a semiconductor substrate, a drift region of a first doping type, a channel region of the second doping type, a source region of the first doping type and a first U-shaped trench, wherein the drain region is provided at the bottom of the semiconductor substrate, the drift region is provided above the drain region, the channel region is provided on both sides of side walls of the first U-shaped trench and above the drift region, the bottom of the first U-shaped trench extends into the drift region, a gate oxide layer covering the channel region is provided on the both side walls of the first U-shaped trench, and the source region is provided at the top of the semiconductor substrate and above the channel region:
a channel region contact region is provided in the channel region, the doping type of the channel region contact region is same as that of the channel region, and a doping concentration of the channel region contact region is greater than that of the channel region; characterized by further comprising:

a second U-shaped trench in the semiconductor substrate, wherein the second U-shaped trench is provided below the first U-shaped trench, the opening width of the second U-shaped trench is smaller than that of the first U-shaped trench, and the depth of the second U-shaped trench is 10-100 nm; and
a field oxide layer is provided in the second U-shaped trench, the thickness of the field oxide layer is greater than that of the gate oxide layer, and a polysilicon gate covering the gate oxide layer and the field oxide layer is provided in the first U-shaped trench and the second U-shaped trench.

A further preferred solution of technical solution 3 of the power MOS transistor of the present invention is as follows: the channel region contact region in technical solution 3 of the present invention is provided at the top of the semiconductor substrate and is adjacent to the source region, or is recessed in the semiconductor substrate.

An upper surface of the polysilicon gate in technical solution 3 of the present invention is lower than an opening surface of the first U-shaped trench, and insulating layers are provided above the polysilicon gate and at the top of the first U-shaped trench.

In technical solution 3 of the present invention, the first doping type is n-type doping, and the second doping type is p-type doping; or the first doping type is p-type doping, and the second doping type is n-type doping.

In technical solution 3 of the present invention, a buffer region is provided in the semiconductor substrate and between the drift region and the drain region, and the buffer region and the drift region have the same doping type.

A method for manufacturing the power MOS transistor based on technical solution 1, 2 or 3 proposed by the present invention as described above, comprising initial steps:
(1) epitaxially forming a silicon epitaxial layer on a silicon substrate where a drain region is formed;
(2) forming a hard mask layer on the surface of the silicon epitaxial layer, and then performing photolithography and etching to form a first U-shaped trench in the silicon epitaxial layer;
(3) forming a first insulating film and a second insulating film successively on the surface of the first U-shaped trench; characterized by further comprising continuing steps:
(4) performing ion implantation to form a charge compensation region in the silicon epitaxial layer at the bottom of the first U-shaped trench;
(5) performing anisotropic etching to etch off the second insulating film and the first insulating film at the bottom of the first U-shaped trench;
(6) etching the silicon epitaxial layer by taking the second insulating film and the first insulating film as masks to form a second U-shaped trench in the silicon epitaxial layer;
(7) forming a field oxide layer on the surface of the second U-shaped trench by an oxidation technology;
(8) completely etching off the second insulating film and the exposed first insulating film;
(9) performing thermal oxidation to form a gate oxide layer on two side walls of the first U-shaped trench respectively, wherein the thickness of the gate oxide layer is smaller than that of the field oxide layer;
(10) performing polysilicon deposition and anisotropic etching to form a polysilicon gate covering the field oxide layer and the gate oxide layer in the first U-shaped trench and the second U-shaped trench, wherein an upper surface of the polysilicon gate is lower than an opening surface of the first U-shaped trench;
(11) performing insulating dielectric layer deposition and isotropic etching to form insulating layers above the polysilicon gate and at the top of the first U-shaped trench, and then etching off all the hard mask layer;

(12) performing ion implantation to form a channel region in the silicon epitaxial layer;

(13) performing photolithography and ion implantation to form a source region above the channel region; and (14) performing photolithography and ion implantation to form a channel region contact region in the channel region;

A further preferred solution of the manufacturing method of technical solution 1, 2 or 3 of the power MOS transistor of the present invention is as follows:

in step (3) of the manufacturing method of the present invention, the first insulating film is made of silicon oxide, and the second insulating film is made of silicon nitride or silicon oxynitride.

Step (4) in the manufacturing method of the present invention may be performed after step (5) or step (6).

Step (4) in the manufacturing method of the present invention is an optional step.

The photolithography and ion implantation of step (14) of the manufacturing method of the present invention may be etching the exposed silicon epitaxial layer first after photolithography, and then performing the ion implantation to form the channel region contact region recessed in the silicon epitaxial layer.

Advantageous Effect

Compared with the prior art, the present invention has the following remarkable advantages:

Firstly, in the power MOS transistor of the present invention, the second U-shaped trench is provided below the first U-shaped trench, which enables the field oxidation stress transition region to be extended, so as to well solve the problem of current leakage caused by the field oxide stress and improve the reliability of the device.

Secondly, the charge compensation region can be formed in the drift region below the second U-shaped trench of the power MOS transistor, thus forming a super-junction structure between the charge compensation region and the drift region, which can improve the breakdown voltage of the power device, i.e., improve the doping concentration of the silicon epitaxial layer and reduce the on-resistance without changing the breakdown voltage of the power MOS transistor.

Thirdly, the second U-shaped trench and the charge compensation region are formed by a self-aligning process, so the technical process is simple, reliable and easy to control and can reduce the manufacturing cost of the power MOS transistor and improve the yield.

DETAILED DESCRIPTION OF THE INVENTION

For clearly illustrating the embodiments of the present invention, the figures listed in the drawings of the description magnify the thicknesses of the layers and the regions of the present invention, and the sizes of the shown figures do not represent the actual sizes; the drawings are schematic, and should not limit the scope of the present invention. The embodiments listed in the description should not be merely limited to the specific shapes of the regions shown in the drawings, but comprise the obtained shapes such as deviation caused by manufacturing, as well as the obtained curves are usually bent or round, which are all represented with a rectangle in the embodiments of the present invention; meanwhile, in the following description, the used term "semiconductor substrate" can be regarded as including a semiconductor wafer being processed as well as other film layers manufactured thereon, such as an epitaxial layer formed on the semiconductor substrate.

The following sectional structure of the present invention, if not especially stated, is the one in the direction of the length of the channel adopting a strip cellular structure.

The following power MOS transistor of the present invention comprises:

technical solution 1, technical solution 2 and technical solution 3 of the power MOS transistor, wherein technical solution 1 and technical solution 2 can be used as a power MOS transistor switch of 20V-1000V, while technical solution 3 can be used as an insulated gate bipolar transistor.

The embodiments of the present invention will be further described in detail below in combination with the accompanying drawings.

Figure 3:
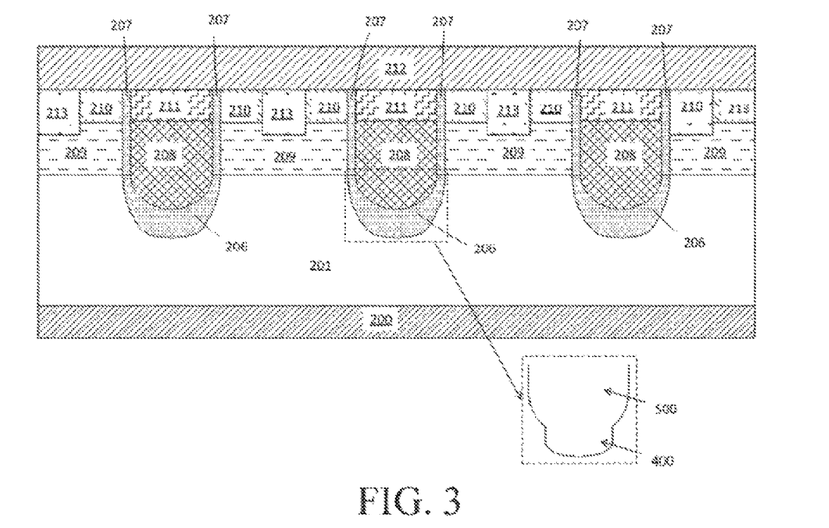
FIG. 3 is a schematic diagram of a sectional structure of an embodiment of technical solution 1 of a power MOS transistor of the present invention.

FIG. 3 is a schematic diagram of a sectional structure of an embodiment of technical solution 1 of the power MOS transistor of the present invention, which is a parallel-connection structure made up of three power MOS transistors of the present invention. As shown in FIG. 3, the power MOS transistor of the present invention comprises a drain region 200 of a first doping type at the bottom of a semiconductor substrate, a silicon epitaxial layer is provided on the drain region 200, and a drift region 201 of the first doping type is provided in the silicon epitaxial layer; a first U-shaped trench 500 is provided in the silicon epitaxial layer, and the bottom of the first U-shaped trench extends into the drift region 201; a second U-shaped trench 400 is provided below the first U-shaped trench 500, the opening width of the second U-shaped trench 400 is smaller than that of the first U-shaped trench, and the depth of the second U-shaped trench 400 is 10-100 nm. The first doping type and the second doping type of the present invention are contrary doping types, e.g. if the first doping type is n-type doping, the second doping type is p-type doping; vice versa, if the first doping type is p-type doping, the second doping type is n-type doping.

The structure in the corresponding dashed box in FIG. 3 shows the structures of the first U-shaped trench 500 and the second U-shaped trench 400 in detail before field oxidation, the second U-shaped trench 400 is provided to extend the field oxide stress transition region between the field oxide layer 206 and the gate oxide layer 207, so as to better solve the problem of current leakage caused by the field oxidation stress and improve the reliability of the device.

A channel region 209 of the second doping type is provided in the silicon epitaxial layer on two sides of the side wall of the first U-shaped trench 500, and a source region 210 of the first doping type is provided in the silicon epitaxial layer on the channel region 209; a channel region contact region 213 is further provided in the channel region 209, the doping type of the channel region contact region 213 is the same as that of the channel region 209, and the channel region contact region 213 is provided at the top of the silicon epitaxial layer and is adjacent to the source region 209.

A gate oxide layer 207 covering the channel region 209 is provided on both side walls of the first U-shaped trench 500, a field oxide layer 206 covers the second U-shaped trench 400, the thickness of the field oxide layer 206 is greater than that of the gate oxide layer 207, a polysilicon gate 208 covering the field oxide layer 206 and the gate oxide layer 207 is provided in the first U-shaped trench 500 and the second U-shaped trench 400, and an upper surface of the polysilicon gate 208 is lower than an opening surface of the first U-shaped trench 500.

A source metal 212 contacting the source region 210 and the channel region contact region 213 is provided on the silicon epitaxial layer, and the source metal 212 is isolated from the polysilicon gate 208 via the insulating layer 212 provided at the top of the first U-shaped trench.

Figure 4:
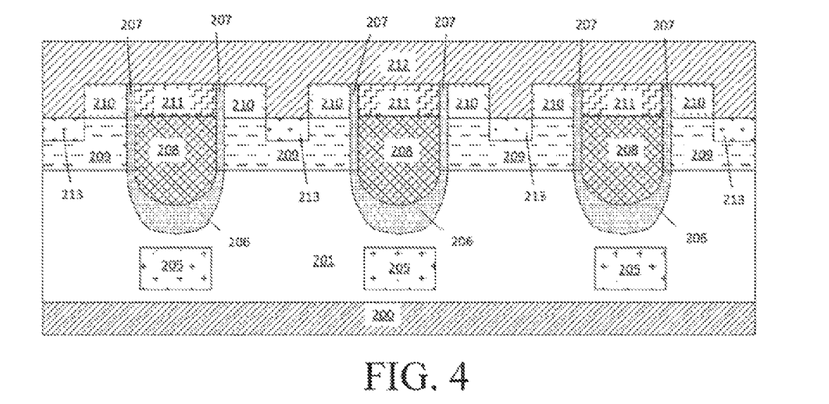
FIG. 4 is a schematic diagram of a sectional structure of an embodiment of technical solution 2 of the power MOS transistor of the present invention.

FIG. 4 is a schematic diagram of a sectional structure of an embodiment of technical solution 2 of the power MOS transistor of the present invention, as shown in FIG. 4, technical solution 2 is based on technical solution 1, a charge compensation region 205 is provided in the drift region 201 at the bottom of the second U-shaped trench, a super-junction structure can be formed between the charge compensation region 205 and the drift region 201, and the super-junction structure can improve the breakdown voltage of the power MOS transistor, i.e., improve the doping concentration of the silicon epitaxial layer and reduce the on-resistance without changing the breakdown voltage of the power MOS transistor.

Figure 5:
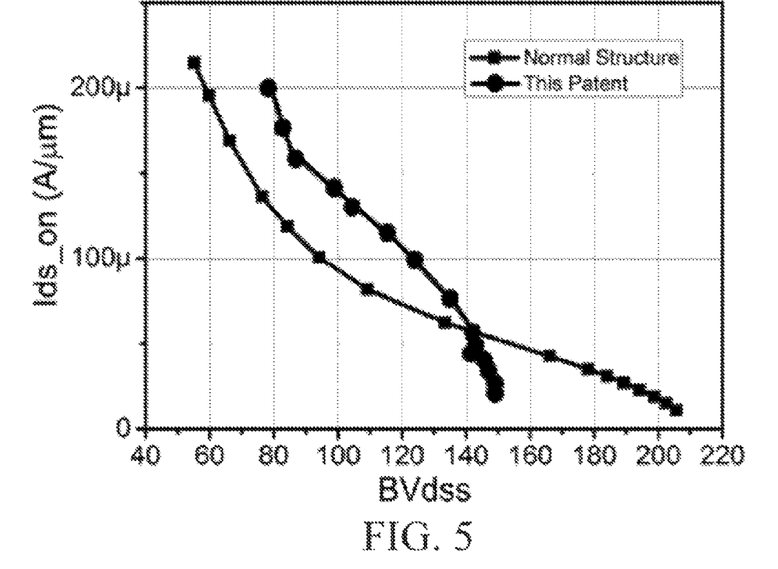
FIG. 5 is a schematic diagram of comparative curves of technical solution 2 of the power MOS transistor of the present invention obtained through simulation and the breakover current of the power MOS transistor of the prior art.

FIG. 5 shows a diagram of comparative curves of technical solution 2 of the power MOS transistor of the present invention obtained through simulation and the breakover current of the power MOS transistor of the prior art. As shown in FIG. 5, the power MOS transistor of the present invention can obtain higher breakover current (Ids on) under the same breakdown voltage (BVdss), i.e. having lower conduct resistance under the same breakdown voltage.

Figure 6:
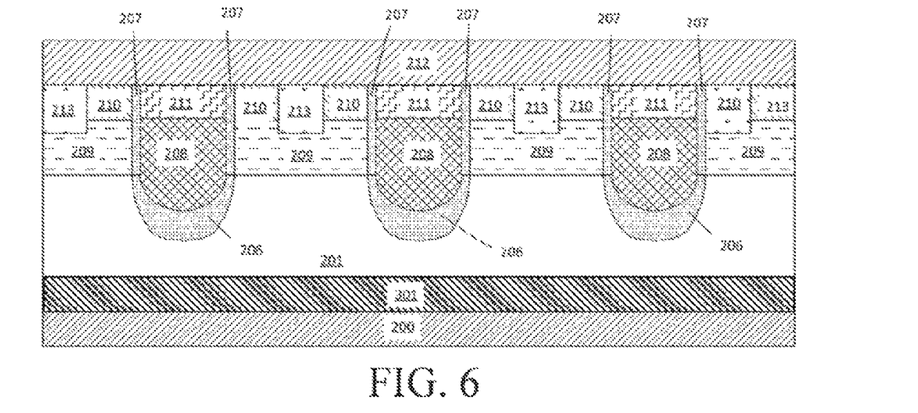
FIG. 6 is a schematic diagram of a sectional structure of an embodiment of technical solution 3 of the power MOS transistor of the present invention.

FIG. 6 is a schematic diagram of a sectional structure of an embodiment of technical solution 3 of the power MOS transistor of the present invention, which is a parallel-connection structure made up of three power MOS transistors of the present invention. As shown in FIG. 6, the power MOS transistor of the present invention comprises a drain region 200 of the second doping type at the bottom of the semiconductor substrate, a silicon epitaxial layer is provided on the drain region 200, a buffer layer 301 of the first doping type is provided at the bottom of the silicon epitaxial layer, and a drift region 201 of the first doping type is provided on the buffer layer 301; a first U-shaped trench is provided in the silicon epitaxial layer, and the bottom of the first U-shaped trench extends into the drift region 201; a second U-shaped trench is provided below the first U-shaped trench, the opening width of the second U-shaped trench is smaller than that of the first U-shaped trench, and the depth of the second U-shaped trench is 10-100 nm. The second U-shaped trench is provided to extend the field oxidation stress transition region between the field oxide layer 206 and the gate oxide layer 207, so as to well solve the problem of current leakage caused by the field oxidation stress and improve the reliability of the device.

The first doping type and the second doping type of the present invention are contrary doping types, e.g. if the first doping type is n-type doping, the second doping type is p-type doping; vice versa, if the first doping type is p-type doping, the second doping type is n-type doping.

A channel region 209 of the second doping type is provided in the silicon epitaxial layer on two sides of the side wall of the first U-shaped trench 500, and a source region 210 of the first doping type is provided in the silicon epitaxial layer on the channel region 209; a channel region contact region 213 is further provided in the channel region 209, the doping type of the channel region contact region 213 is the same as that of the channel region 209, and the channel region contact region 213 is provided at the top of the silicon epitaxial layer and is adjacent to the source region 209.

A gate oxide layer 207 covering the channel region 209 is provided on both sides of the first U-shaped trench 500, a field oxide layer 206 covers the second U-shaped trench 400, the thickness of the field oxide layer 206 is greater than that of the gate oxide layer 207, a polysilicon gate 208 covering the field oxide layer 206 and the gate oxide layer 207 is provided in the first U-shaped trench 500 and the second U-shaped trench 400, and an upper surface of the polysilicon gate 208 is lower than an opening surface of the first U-shaped trench 500.

A source metal 212 contacting the source region 210 and the channel region contact region 213 is provided on the silicon epitaxial layer, the source metal 212 is isolated from the polysilicon gate 208 via the insulating layer 212 provided at the top of the first U-shaped trench.

Technical solution 3 of the power MOS transistor of the present invention can be used as an insulated gate bipolar transistor, the buffer layer 301 is a common structure in the insulated gate bipolar transistor, and the buffer layer 301 can also not be provided as required, while the drift region is directly provided on the drain region.

Figure 7:
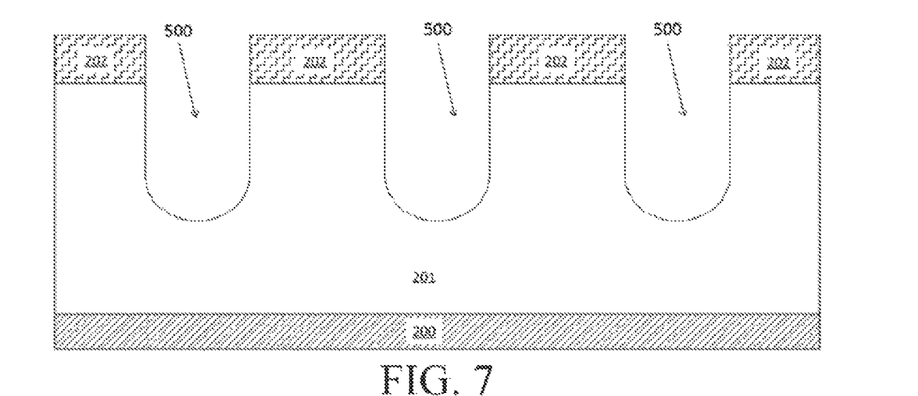
FIG. 7 to FIG. 17 are schematic diagrams of process flows of an embodiment of the manufacturing method of technical solutions 1 and 2 of the power MOS transistor of the present invention.
Figure 8:
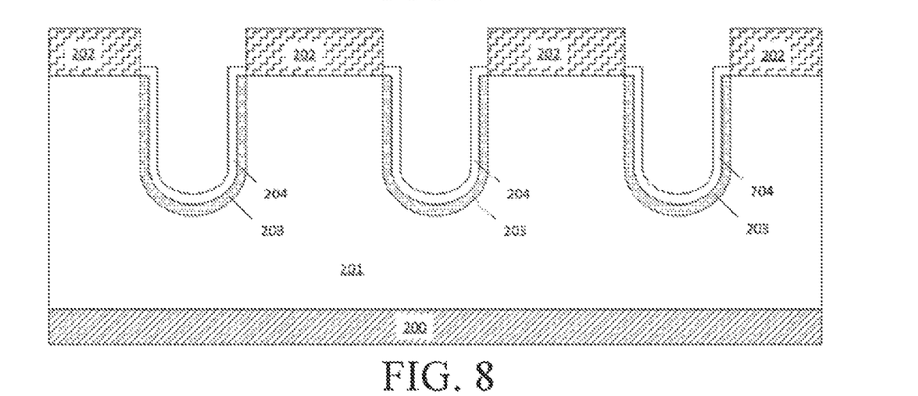
Figure 9:
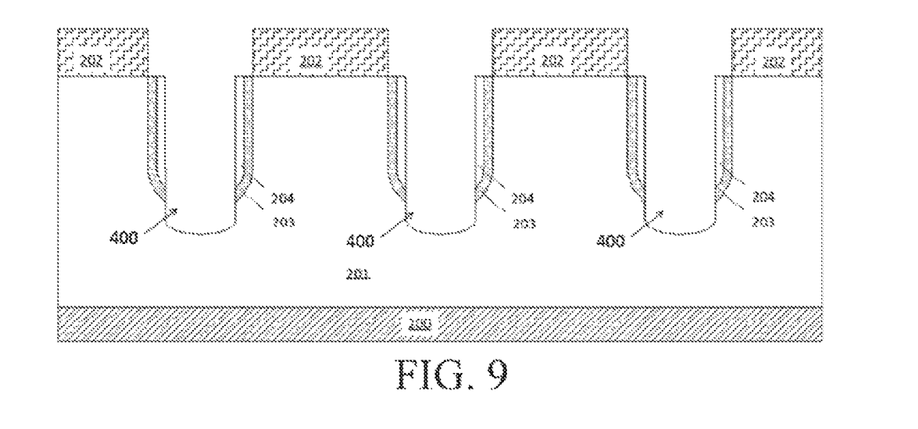
Figure 10:
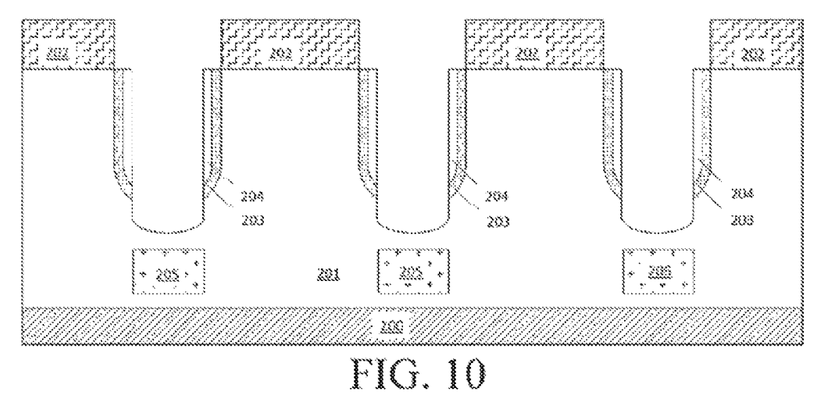
Figure 11:
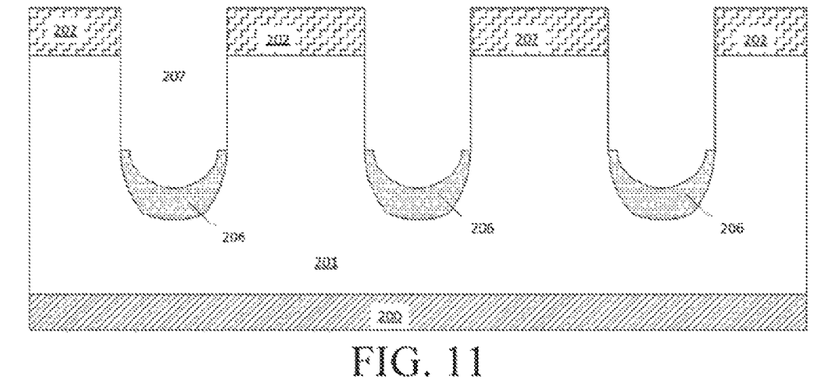
Figure 12:
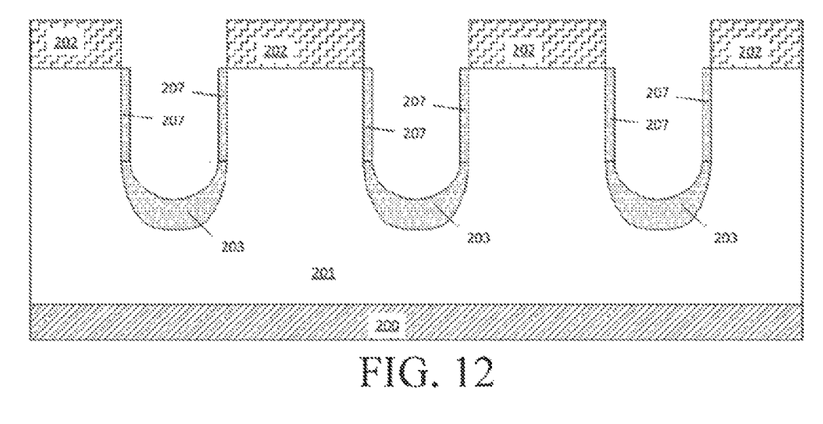
Figure 13:
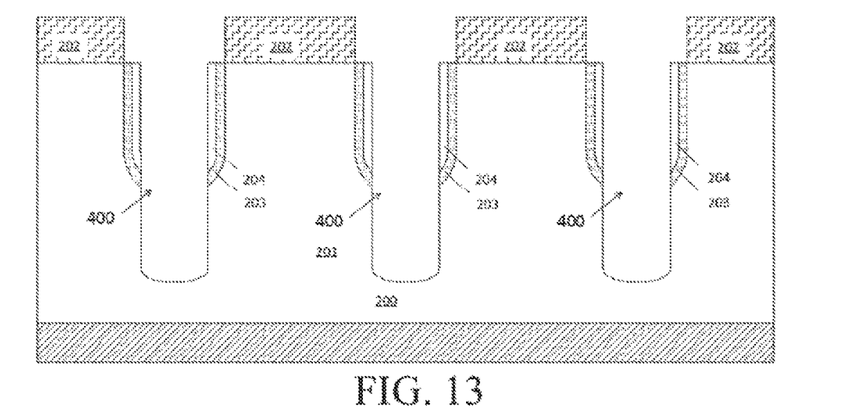
Figure 14:
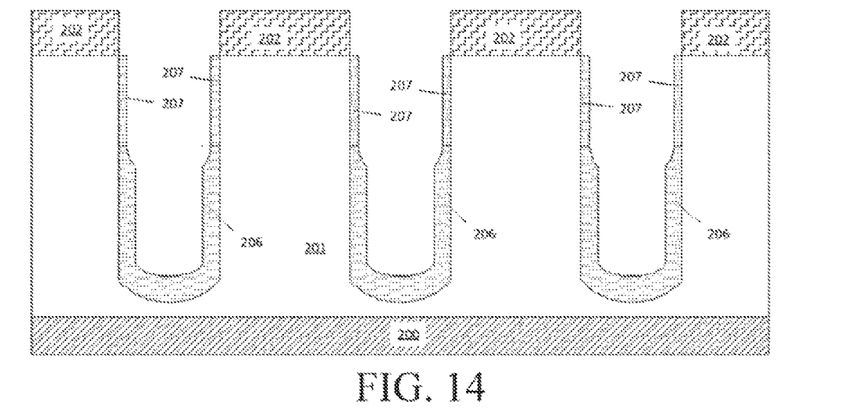
Figure 15:
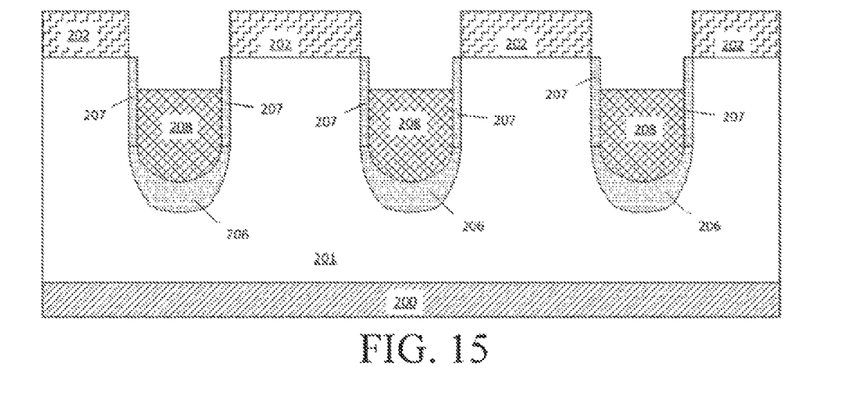
Figure 16:
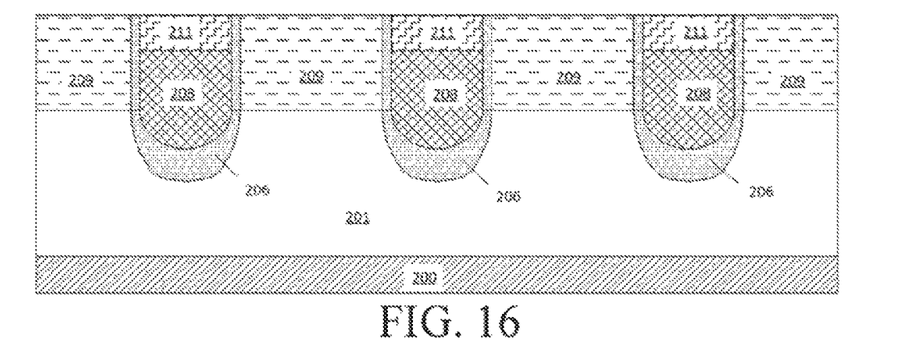
Figure 17:
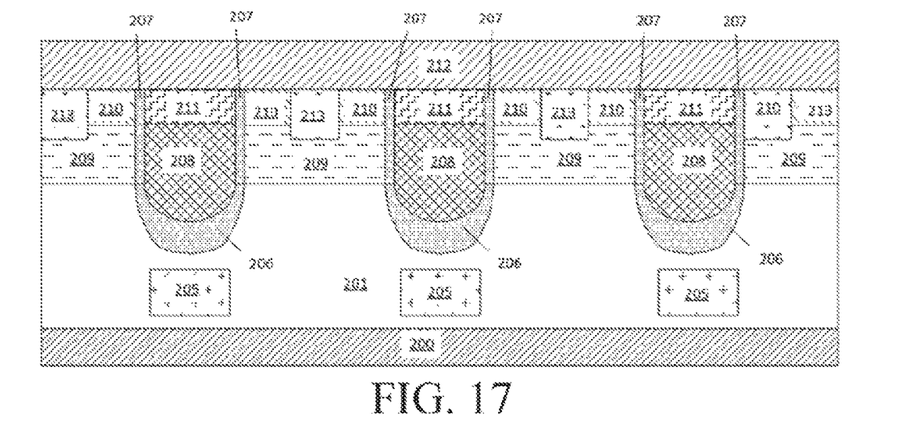

FIG. 7 to FIG. 19 are schematic diagrams of process flows of an embodiment of a manufacturing method of technical solution 1, 2 or 3 of the power MOS transistor proposed by the present invention. In the embodiment, the method is used for simultaneously manufacturing three parallel-connection power MOS transistors of U-shaped trenches in the present invention, and successively comprises specific steps as follows:

In combination with FIG. 7, epitaxially forming a silicon epitaxial layer 201 on a drain region 200 in a semiconductor substrate, then forming a hard mask layer 202 on the silicon epitaxial layer 201, performing photolithography and etching afterwards, and forming a first U-shaped trench 500 in the silicon epitaxial layer, wherein the hard mask layer 202 generally includes a thin pad oxide layer and a thick silicon nitride dielectric layer, and the thin oxide layer is used for improving the stress between the silicon nitride layer and the silicon epitaxial layer;

Next, in combination with FIG. 8, forming a first insulating film 203 by oxidation on the surface of the first U-shaped trench 500, wherein the first insulating film 203 is made of silicon oxide, and its thickness range is 10-20 nm; next, continuously forming a second insulating film 204 on the surface of the first insulating film 203, wherein the second insulating film 204 is made of silicon nitride or silicon oxynitride, and its thickness range is preferably 10-20 nm;

Next, in combination with FIG. 9, etching off the second insulating film 204 and the first insulating film 203 at the bottom of the first U-shaped trench 500 by adopting an anisotropic etching method such as a plasma etching method, and continuously etching the silicon epitaxial layer by 10-100 nm with the second insulating film 204 and the first insulating film 203 as masks, to form a second U-shaped trench 400 in the silicon epitaxial layer;

As required, after forming the second insulating film 204 and the first insulating film 203 or forming the second U-shaped trench 400, forming a charge compensation region 205 in the silicon epitaxial layer at the bottom of the second U-shaped trench 400 through an ion implantation method, as shown in FIG. 10, wherein this step is an optional step;

Next, in combination with FIG. 11, oxidizing the field oxide layer to form a field oxide layer 206 covering the second U-shaped trench, and then washing away the second insulating film 204 and the first insulating film 203 on two side walls of the first U-shaped trench 500;

Next, in combination with FIG. 12, oxidizing a gate oxide layer 207 to form the gate oxide layer 207 on both sides of the first U-shaped trench;

As required, when the silicon epitaxial layer is continuously etched by taking the second insulating film 204 and the first insulating film 203 as masks, forming the second U-shaped trench 400 with the depth of 100-2000 nm, as shown in FIG. 13, and then oxidizing the field oxide layer 206 and the gate oxide layer 207, as shown in FIG. 14, wherein by adopting the manufacturing method of the power MOS transistor of the present invention and forming the second U-shaped trench 400 of the deep trench structure as shown in FIG. 14, the manufacturing process of the power MOS transistor of the U-shaped trench as shown in FIG. 1 can be simplified, the manufacturing cost of the power MOS transistor can be reduced and the yield thereof can be improved;

Next, in combination with FIG. 15, depositing polysilicon and performing isotropic etching, to form a polysilicon gate 208 covering the gate oxide layer 207 and the field oxide layer 206 in the first U-shaped trench 500 and the second U-shaped trench 400, wherein an upper surface of the polysilicon gate 208 is lower than an opening surface of the first U-shaped trench;

Next, in combination with FIG. 16, depositing an insulating dielectric layer and performing isotropic etching to form an insulating layer 211 above the polysilicon gate 208 and at the top of the first U-shaped trench, and performing ion implantation after the hard mask layer 202 is etched off to form a channel region 209 in the silicon epitaxial layer, wherein the insulating layer 211 can be made of silicon oxide;

As required, forming a doping region at the top of the silicon epitaxial layer directly with an ion implantation method in the channel region 209 of the present invention after epitaxy of the silicon epitaxial layer 201 on the drain region 200, and segmenting the formed doping region by the first U-shaped trench 500 formed later to form the channel region 209;

Finally, in combination with FIG. 17, performing primary photolithography and ion implantation to form a source region 210 on the channel region 209, wherein the source region 210 is provided at the top of the silicon epitaxial layer on both sides of the first U-shaped trench 500; and then performing secondary photolithography and ion implantation to form a channel region contact region 213 in the channel region 209, and finally forming a source metal 212 at the joint of the source region 210 and the channel region contact region 213.

As required, before the ion implantation of the channel region doping region 213, the silicon epitaxial layer can be etched first with photoresist as a mask, the ion implantation is performed afterwards, thus the channel region contact region 213 recessed in the silicon epitaxial layer is formed, and the power MOS transistor structure as shown in FIG. 4 is formed.

Figure 18:
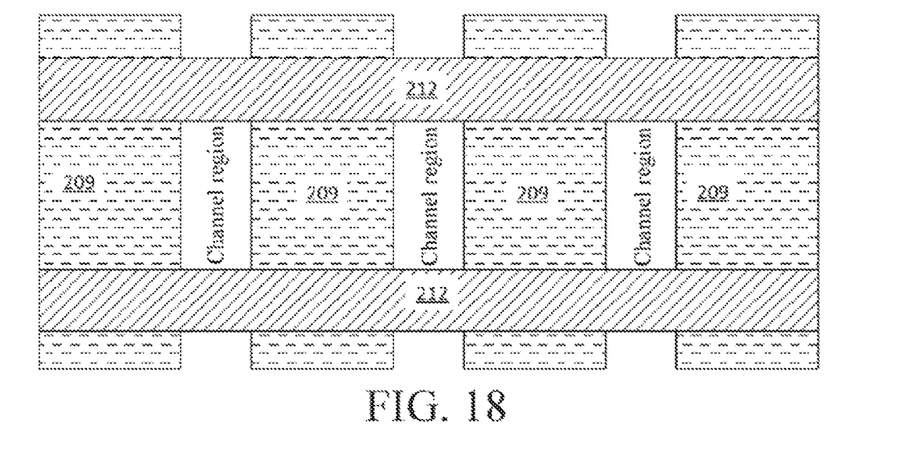
FIG. 18 is an overview schematic diagram of the first embodiment of technical solution 1, 2, or 3 of the power MOS transistor of the present invention.
Figure 19:
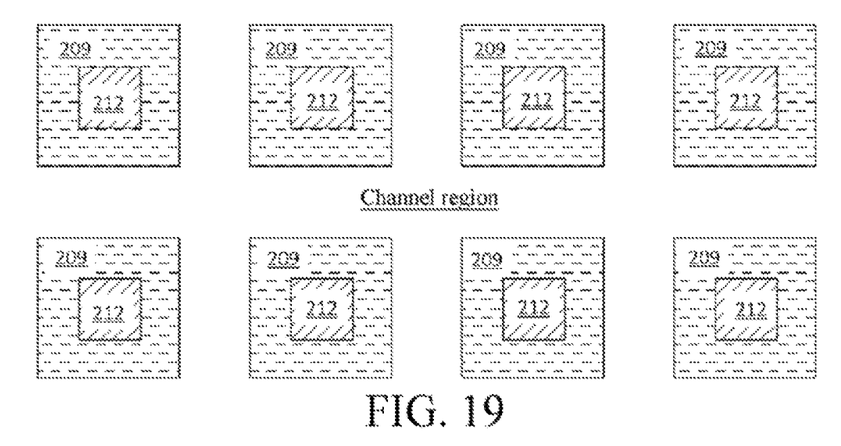
FIG. 19 is an overview schematic diagram of the second embodiment of technical solution 1, 2, or 3 of the power MOS transistor of the present invention.

The device cells of technical solution 1, technical solution 2 and technical solution 3 of the power MOS transistor of the present invention can have a strip structure or a well-shaped structure; wherein, the overlooking schematic diagram of the strip cellular structure is as shown in FIG. 18, and the overlooking schematic diagram of the well-shaped cellular structure is as shown in FIG. 19.

The description not related to the embodiments of the present invention belongs to the known technology of this art, and can be implemented with reference to the known technology.

The above specific implementations and embodiments are a specific support for the technical ideas of the power MOS transistor and the manufacturing method thereof proposed by the present invention, and the protection scope of the present invention cannot be limited thereto. Any equivalent variations or modifications made according to the technical ideas of the present invention on the basis of this technical solution shall fall into the protection scope of the technical solution of the present invention.

What is claimed is:

1. A power Metal Oxide Semiconductor (MOS) transistor, comprising:
 a drain region of a first doping type in a semiconductor substrate, a drift region of the first doping type, a channel region of a second doping type, a source region of the first doping type and a first U-shaped trench, wherein the drain region is provided at a bottom of the semiconductor substrate, the drift region is provided above the drain region, the channel region is provided on both sides of side walls of the first U-shaped trench and above die drift region, a bottom of the first U-shaped trench extends into the drift region, a gate oxide layer covering the channel region is provided on, and the source region is provided at a top of the semiconductor substrate and above the channel region;
 a channel region contact region is provided in the channel region, the doping type of the channel region contact region is die same as that of the channel region, and a doping concentration of the channel region contact region is greater than that of the channel region;
 a second U-shaped trench in the semiconductor substrate, wherein the second U-shaped trench is provided below the first U-shaped trench, a opening width of the second U-shaped trench is smaller than that of the first U-shaped trench, and a depth of the second U-shaped trench is 10-100 nm;

a field oxide layer is provided hi the second U-shaped trench, a thickness of the field oxide layer is greater than that of the gate oxide layer, a charge compensation region is provided in the drift region below the field oxide layer, and the charge compensation region has the second doping type, the second U-shaped trench extends a field oxide stress transition region between the field oxide layer and the gate oxide layer, and a thickness of a bottom portion of the field oxide layer is thicker than a thickness of side portions of the field oxide layer; and a polysilicon gate covering the gate oxide layer and the field oxide layer is provided in the first U-shaped trench and the second U-shaped trench.

2. The power MOS transistor of claim 1, wherein the channel region contact region is provided at the top of the semiconductor substrate and is adjacent to the source region, or the channel region contact region is recessed in the semiconductor substrate.

3. The power MOS transistor of claim 1, wherein an upper surface of the polysilicon gate is lower than an opening surface of the first U-shaped trench, and an insulating layer is provided above the polysilicon gate and at the top of the first U-shaped trench.

4. The power MOS transistor of claim 1, wherein the first doping type is n-type doping, and the second doping type is p-type doping; or, the first doping type is p-type doping, and the second doping type is n-type doping.

* * * * *